United States Patent
Betsui

(10) Patent No.: US 11,742,336 B2
(45) Date of Patent: Aug. 29, 2023

(54) SEMICONDUCTOR DEVICE AND POWER MANAGEMENT IC

(71) Applicant: RENESAS ELECTRONICS CORPORATION, Tokyo (JP)

(72) Inventor: Takafumi Betsui, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 328 days.

(21) Appl. No.: 17/030,712

(22) Filed: Sep. 24, 2020

(65) Prior Publication Data

US 2021/0134771 A1 May 6, 2021

(30) Foreign Application Priority Data

Nov. 5, 2019 (JP) .................................. 2019-200646

(51) Int. Cl.
| | | |
|---|---|---|
| *H01L 23/538* | (2006.01) |
| *H01L 25/16* | (2023.01) |
| *H02M 3/155* | (2006.01) |
| *H02M 1/44* | (2007.01) |

(52) U.S. Cl.
CPC .......... *H01L 25/16* (2013.01); *H01L 23/5384* (2013.01); *H01L 23/5386* (2013.01); *H02M 3/155* (2013.01); *H02M 1/44* (2013.01)

(58) Field of Classification Search
CPC .. H01L 23/5386; H01L 23/5384; H01L 25/16
See application file for complete search history.

(56) References Cited

U.S. PATENT DOCUMENTS

| | | | | |
|---|---|---|---|---|
| 8,982,563 B2* | 3/2015 | Raj | ...................... | H05K 7/1092 |
| | | | | 361/721 |
| 10,609,844 B1* | 3/2020 | Wu | ........................ | H05K 7/209 |
| 10,903,737 B2 | 1/2021 | Takeda et al. | | |
| 2003/0081389 A1* | 5/2003 | Nair | ........................ | H01L 25/16 |
| | | | | 361/764 |

(Continued)

FOREIGN PATENT DOCUMENTS

| | | |
|---|---|---|
| JP | 2014-030285 A | 2/2014 |
| JP | 2015-198566 A | 11/2015 |

(Continued)

OTHER PUBLICATIONS

Japanese Notice of Reasons for Refusal issued in corresponding Japanese Patent Application No. 2019-200646, dated Jan. 30, 2023, with English translation.

*Primary Examiner* — Errol V Fernandes
(74) *Attorney, Agent, or Firm* — McDermott Will & Emery LLP

(57) ABSTRACT

Semiconductor device has a regulator circuit having an even number of switching regulators that generate output power from an input power supply and a power management IC that controls the output potential generated by the switching regulator. semiconductor device is characterized in that a group of half of the even number of switching regulators is arranged on a first surface of semiconductor device system board, and a group of switching regulators, which is the remaining half, is arranged on a second surface that is in front-back relation with the first surface. This semiconductor device reduces semiconductor device board-area (pattern-resource).

13 Claims, 13 Drawing Sheets

(56) References Cited

U.S. PATENT DOCUMENTS

| | | | | |
|---|---|---|---|---|
| 2006/0071650 A1* | 4/2006 | Narendra | ............... | H01L 25/18 |
| | | | | 323/285 |
| 2012/0112352 A1* | 5/2012 | Chi | ...................... | H01L 23/481 |
| | | | | 257/784 |
| 2012/0182650 A1* | 7/2012 | Chi | ........................ | H01L 23/60 |
| | | | | 438/107 |
| 2016/0254745 A1* | 9/2016 | Lim | ....................... | H01L 25/16 |
| | | | | 327/540 |
| 2017/0237344 A1* | 8/2017 | Andry | ................... | H01L 25/065 |
| | | | | 327/109 |
| 2020/0381351 A1* | 12/2020 | Calugaru | ............ | H01L 23/3672 |
| 2021/0328513 A1 | 10/2021 | Sasao et al. | | |

FOREIGN PATENT DOCUMENTS

| | | |
|---|---|---|
| JP | 2020-065428 A | 4/2020 |
| WO | 2017/175645 A1 | 10/2017 |
| WO | 2018/199228 A1 | 11/2018 |

* cited by examiner

SEMICONDUCTOR DEVICE AND POWER MANAGEMENT IC

CROSS-REFERENCE TO RELATED APPLICATIONS

The disclosure of Japanese Patent Application No. 2019-200646 filed on Nov. 5, 2019 including the specification, drawings and abstract is incorporated herein by reference in its entirety.

BACKGROUND

The present invention relates to semiconductor device and, in particular, to semiconductor device mounted in high-power embedded systems.

Although many types of power supply is required in the in-vehicle semiconductor system using automobile SoC (System-on-Chip) such as ADAS (Advanced Driving Assistance System), the largest SoC core power supply circuit of the current consumption in particular among the power supply board area (pattern resource) occupying the ratio is relatively high. Further, as a main factor occupying the board area (pattern resources), the number of power supply circuit components required is large, the number of through holes of the power supply path is large.

A system board on which an automobile SoC is mounted requires many types of power supplies and has a large current consumption. As a technology to the system board on which vehicle-mounted semiconductor system, there are the applications of switching regulators, multi-phased switching regulators, and a multi-layered plane of a large current power supply pattern.

The merits and demerits in the applications of the switching regulators and its multi-phase are explained.

(1) A switching regulator with high conversion efficiency is used for a large current power supply. When using a switching regulator, the output stage requires the following components, so the power supply pattern and mounting area are increased.

(a) Large capacitors for smoothing
(b) Capacitors for switching noise suppression
(c) Large inductors for smoothing (2) The response time is shortened by the multi-phase in the power supply of low voltage and large current. Multi-phase reduces response time while increasing the mounting and pattern area required by a multi-phased number.

(3) Many through holes (hereinafter, TH) are used to connect multiple layers of power supplies between layers. The proper current flowing through a single TH is determined by the thickness of the copper foil and the TH diameter, based on the temperature rise of the copper foil. For example, if it 0.8 A/TH at φ0.65 mm, for the current of 40 A, 50 THs are required for each of the power supply and GND, for a total of 100 THs. If the clearance is 100 um, there are THs with φ0.9 mm in all layers.

SUMMARY

However, the prior art has the following problems.

(1) Mounting area of the power generation circuit is increased. Though the technique using the switching regulator in the multi-phase is becoming the mainstream for the power supply generation of large current and low voltage, the number of components of die power supply generating circuit increases in this technique, and the mounting area increases.

(2) TH makes the board area (pattern resource) tight. Supply path of the power supply increases the cross section of the conductor (mainly made of copper) by forming a wide pattern such as a plane in a plurality of layers. Each layer is connected by TH, but the board area (pattern resource) is scraped in the layer not related to the power supply pattern. The higher current increases the number of THs, as a result, the board area (pattern resources) is tightened.

(3) The use efficiency of the power supply pattern placed in the layer far from the regulator circuit is poor. When arranging the power supply pattern in a plurality of layers, resistor and impedance of the supply path in the far layer when viewed from the regulator circuit as a power supply source are increased by the resistance component and the inductance component of TH as compared with the near layer. Therefore, even if a power supply pattern having the same thickness and the same shape is formed in a plurality of layers, a current hardly flows in the power supply pattern of the layer far from the regulator circuit. That is, the power supply pattern of the distant layer decreases the amount of current flowing per cross-sectional area of the conductor.

An object of the present invention is to reduce the board area (pattern resource) of semiconductor device occupied by the regulator circuit. Other objects and novel features will become apparent from the description of the specification and drawings.

Semiconductor device according to an embodiment, a plurality of regulator circuits are arranged separately on the front and back surfaces of the system board.

Semiconductor device according to another embodiment, in the inner layer power supply pattern connecting the regulator circuit and the SoC power supply terminal, the power supply path is different for each layer, and further, the terminals of the power supply destination are arranged differently for each layer.

In semiconductor device according to an embodiment, since a plurality of regulator circuits are arranged separately on the front and back surfaces of the system board, the area dedicated by the regulator circuit can be greatly reduced in the system board.

DETAILED DESCRIPTION

Figure 1:
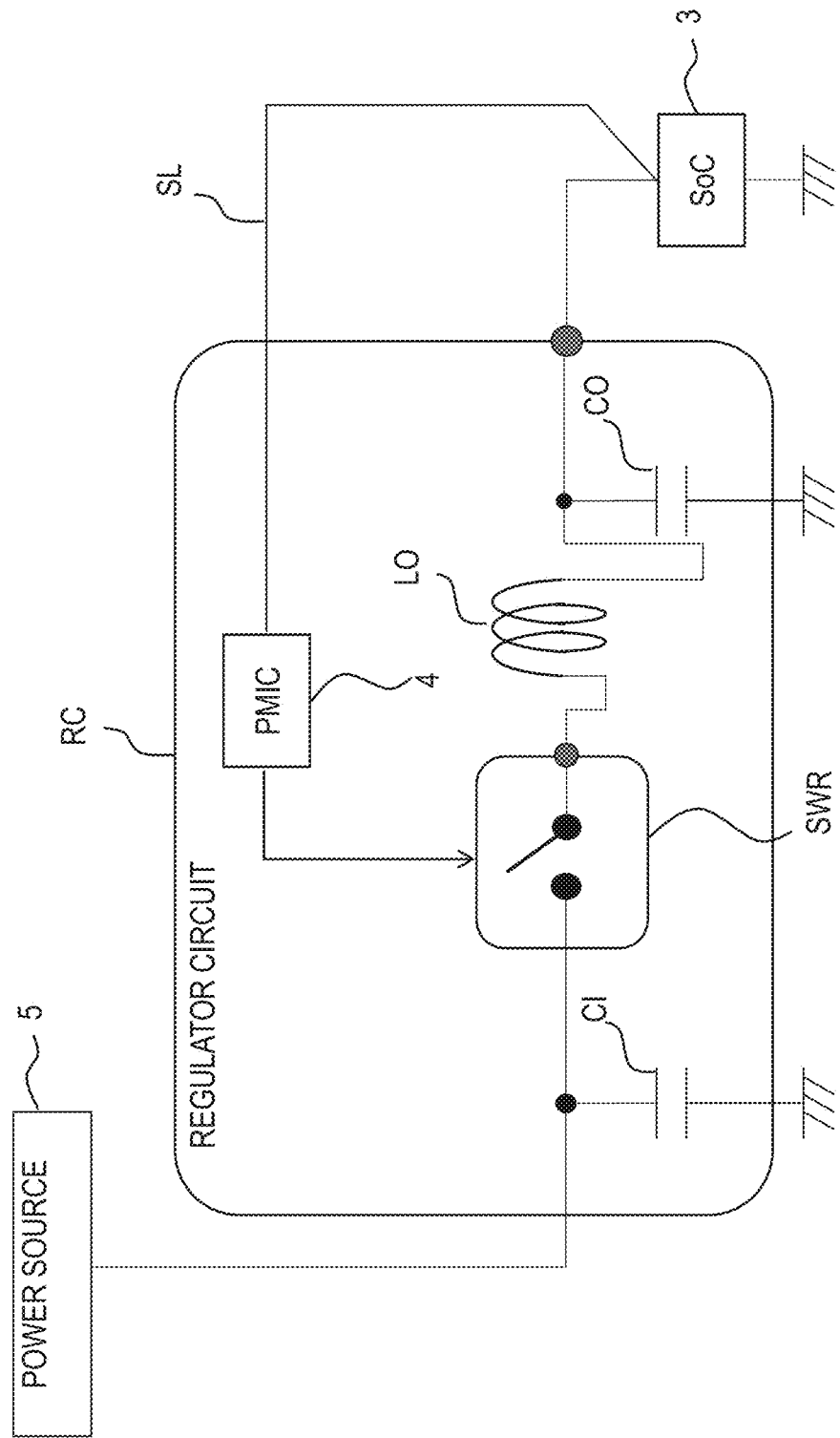
FIG. 1 is a configuration diagram including a semiconductor device according to an embodiment.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments and each modification may be arbitrarily combined with each other.

(Configuration of Semiconductor Device)

Figure 2:
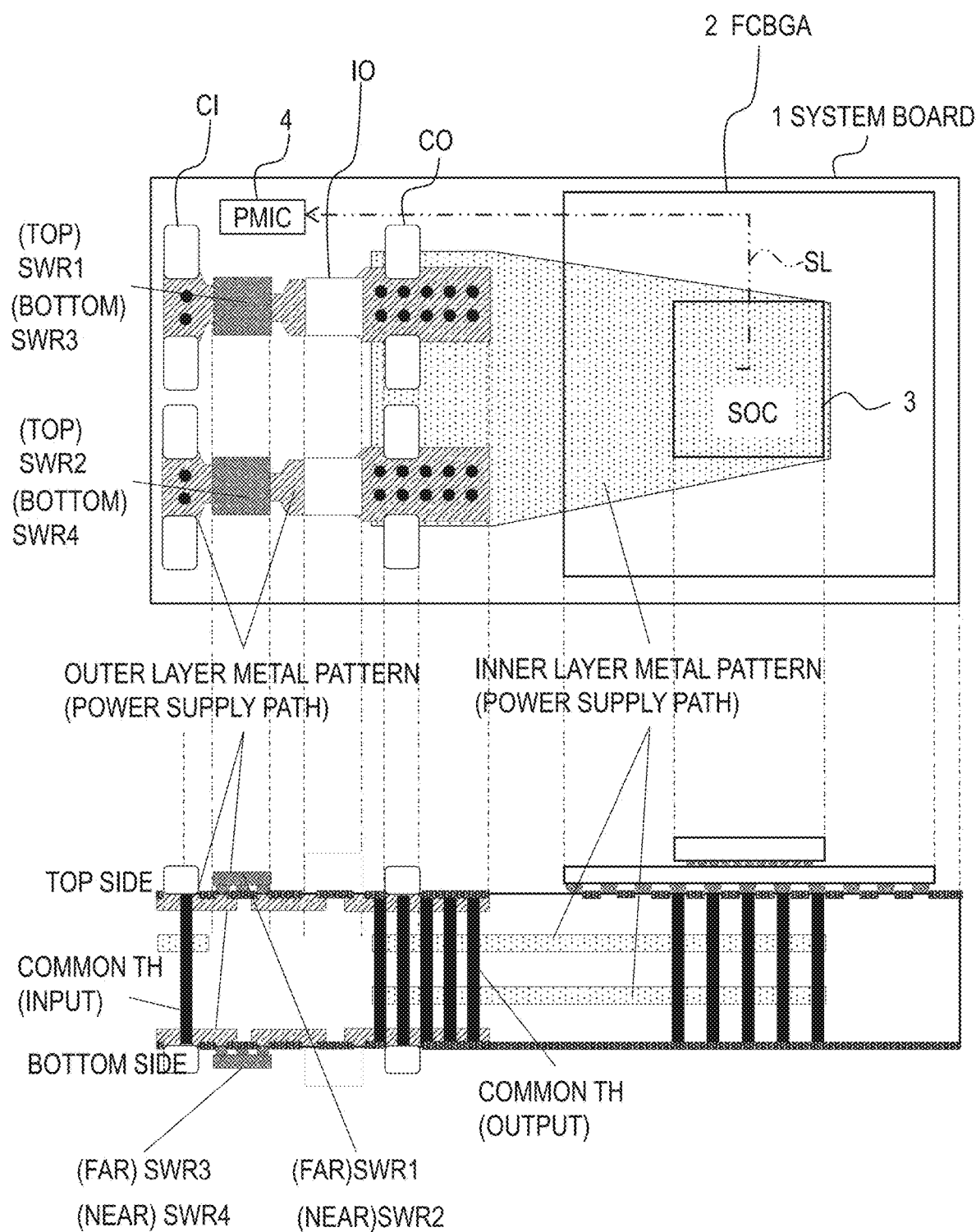
FIG. 2 is a diagram showing a plane and a cross section with respect to the regulator circuit arrangement according to an embodiment.

FIG. 1 is a conceptual block showing the entire configuration including semiconductor device according to present embodiment. FIG. 2 is a diagram showing a plane and a cross section with respect to the regulator circuit arrangement according to an embodiment.

As shown in FIG. 2, in semiconductor device 100, SoC 3 of an FCBGA (Flip Chip Ball Grid Array) package 2 is mounted on the surface (TOPs) of the system board 1. A regulator circuit RC that includes four switching regulators SWR1-SWR4 that provide power to SoC 3 is mounted on the front (TOP) and back (BOTTOM) surfaces of the system board 1. Between the regulator circuit RC and the power supply terminal of FCBGA package 2 is a power supply path by electrically connecting by a wide conductor pattern formed in the inner two layers of the system board 1 (hereinafter, the plane).

(Regulator Circuit)

As shown in FIG. 1, in semiconductor device 100, the regulator circuit RC is composed of switching regulators SWR (SWR1-SWR4) for generating an output power supply from the input power source generated by the power supply source (POWER SOURCE) 5 and the output inductor LO and the input capacitor CI and the output capacitor CO. The switching regulators SWR are controlled to keep the output potential constant by Power Management IC (PMIC) 4. The PMIC4 observes the potential of the power supply terminal of SoC3 to be fed by the sense line SL and controls the switching regulator SWR so that the output power supply of the regulator circuit RC maintains a constant potential.

The output terminal of the switching regulator SWR is electrically connected by the terminal of the output inductor LO and a wide plane formed on the surface layer of the system board 1. The other terminal of the output inductor is electrically connected to TH through the system board 1 in a wide plane formed separately from the plane connected to the switching regulators SWR. In addition, this plane is electrically connected to the terminal of the output capacitor CO. The terminal of the output capacitor CO is electrically connected to GND is a reference voltage of die output power supply of the switching regulators SWR.

(Arrangement and Connection of Switching Regulator)

As shown in FIG. 2, the four switching regulators SWR1-SWR4 are arranged in a set of two switching regulators SWR1 and SWR2 on one side of the system board 1 (surface or first side: TOP) and in a set of two switching regulators SWR3 and SWR4 on the other side of the system board 1 (back or second side: BOTTOM). That is, in case that the number of the switching regulators is even (in this example, four), the half of the switching regulators (in this example, SW1 and SW2) is arranged on the first surface (front surface) of the system board 1 of semiconductor device 100 as the first switching regulator group, the remaining half (in this example, SWR3 and SWR4) is arranged on the second surface (back surface) which is in front-back relation with the first surface as the second switching regulator group. Consequently, the switching regulators SWR1-SWR4 are distributed on both sides of the front surface (TOP) and the back surface (BOTTOM) of the system board 1.

The switching regulator SWR3 is mounted at the position of the back side (BOTTOM) of the system board 1 corresponding to the lower side of the mounting position of the switching regulator SWR1. Further, the switching regulator SWR4 is mounted at the position of the rear surface (BOTTOM) of the system board 1 corresponding to the lower side of the mounting position of the switching regulator SWR2. The four switching regulators SWR1-SWR4 are controlled so as to deliver the same potential by a PMIC4. The switching regulators SWR1 and SWR3 and the switching regulators SWR2 and SWR4 arranged on the opposite surface share the TB (COMMON TH (OUTPUT)) of the output stage of the circuit and share the TH (COMMON TH (INPUT)) of the input stage of the circuit. In addition, the TB (COMMON TH (OUTPUT)) is electrically connected with two layers of planes of the inner layer (INNER LAYER METAL PATTERN) of the system board 1.

Incidentally, in FIG. 2, (TOP) SWR1 and (TOP) SWR2 are mounted on the surface of system board 1 (TOP SIDE). (BOTTOM) SWR3 and (BOTTOM) SWR4 are mounted on the back surface of system board 1 (BOTTOM SIDE). (FAR) SWR1 and (FAR) SWR3 are mounted on the back side of system board 1. (NEAR) SWR2 and (NEAR) SWR4 are mounted on the front side of system board 1. Further, OUTER LAYER shows the outer wiring layer provided on the surface of system board 1 (TOP SIDE) or on the back surface of system board 1 (BOTTOM SIDE). INNER LAYER shows the inner wiring layer provided inside of the system board 1.

(Component Arrangement of Switching Regulator)

Figure 3:
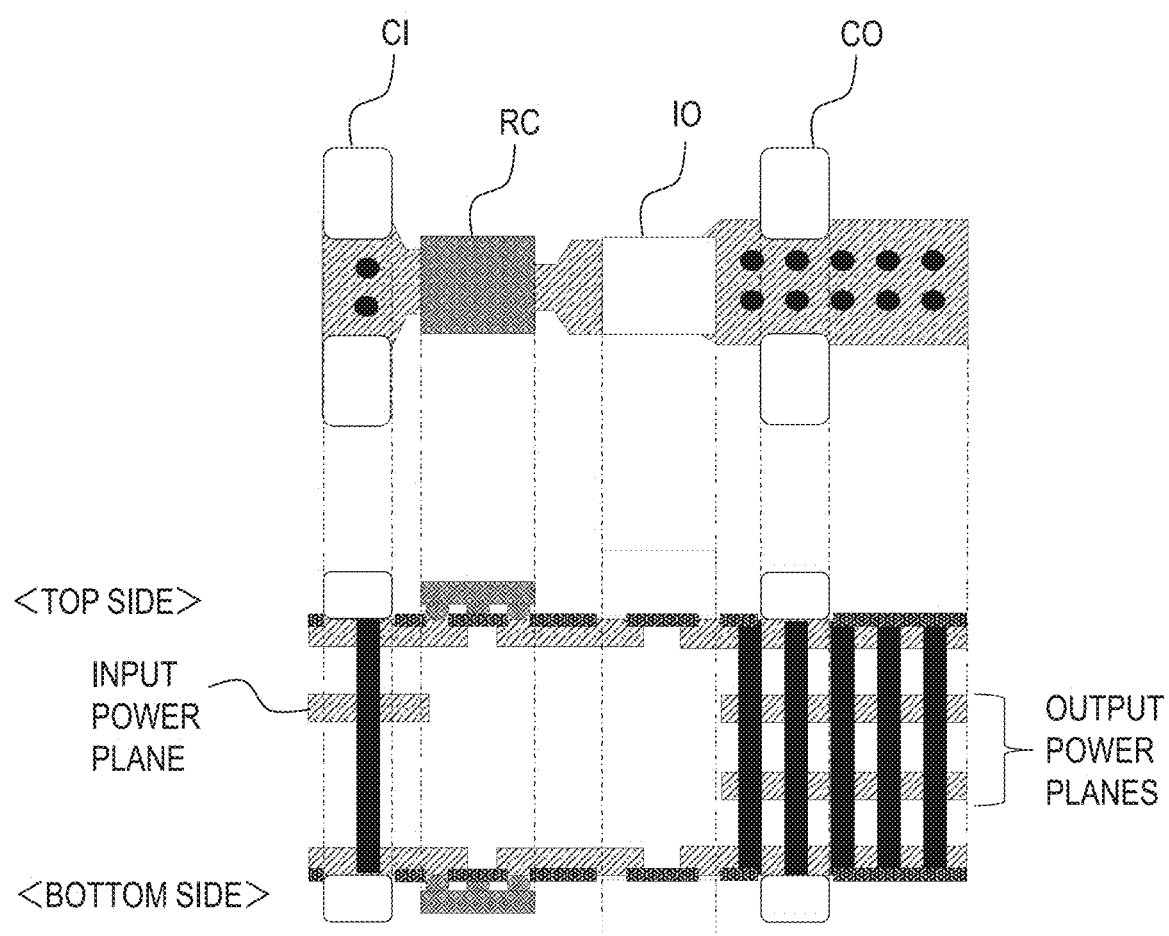
FIG. 3 is a diagram showing a plane and a cross section with respect to the component arrangement of the regulator circuit according to an embodiment.

FIG. 3 is a diagram showing a plane and a cross section with respect to the component arrangement of the regulator circuit according to an embodiment. FIG. 3 illustrates the transmission plan view and cross-sectional view of the switching regulators SWR1 and SWR3 of FIG. 2 and components (CIs, LOs, COs) connected to the switching regulators SWR1 and SWR3 as typical examples. As shown in FIG. 3, the components (SWR1, SWR3, CI, LO, CO) mounted on the front and back surfaces of the system board 1 are arranged at positions where the components on the front and back surfaces overlap when viewed from the transmission plan view from the front surface of the system board 1. It is possible to reduce the area required for the most part arrangement and wiring when the components (SWR1, SWR3, CI, LO and CO) on the front and back surfaces are arranged so as to overlap perfectly. Although not shown, the arrangement of the switching regulators SWR2 and SWR4 of FIG. 2 and the components (CI, LO and CO) connected to the switching regulators SWR2 and SWR4 is also similar to the arrangement as shown in FIG. 3.

Figure 4:
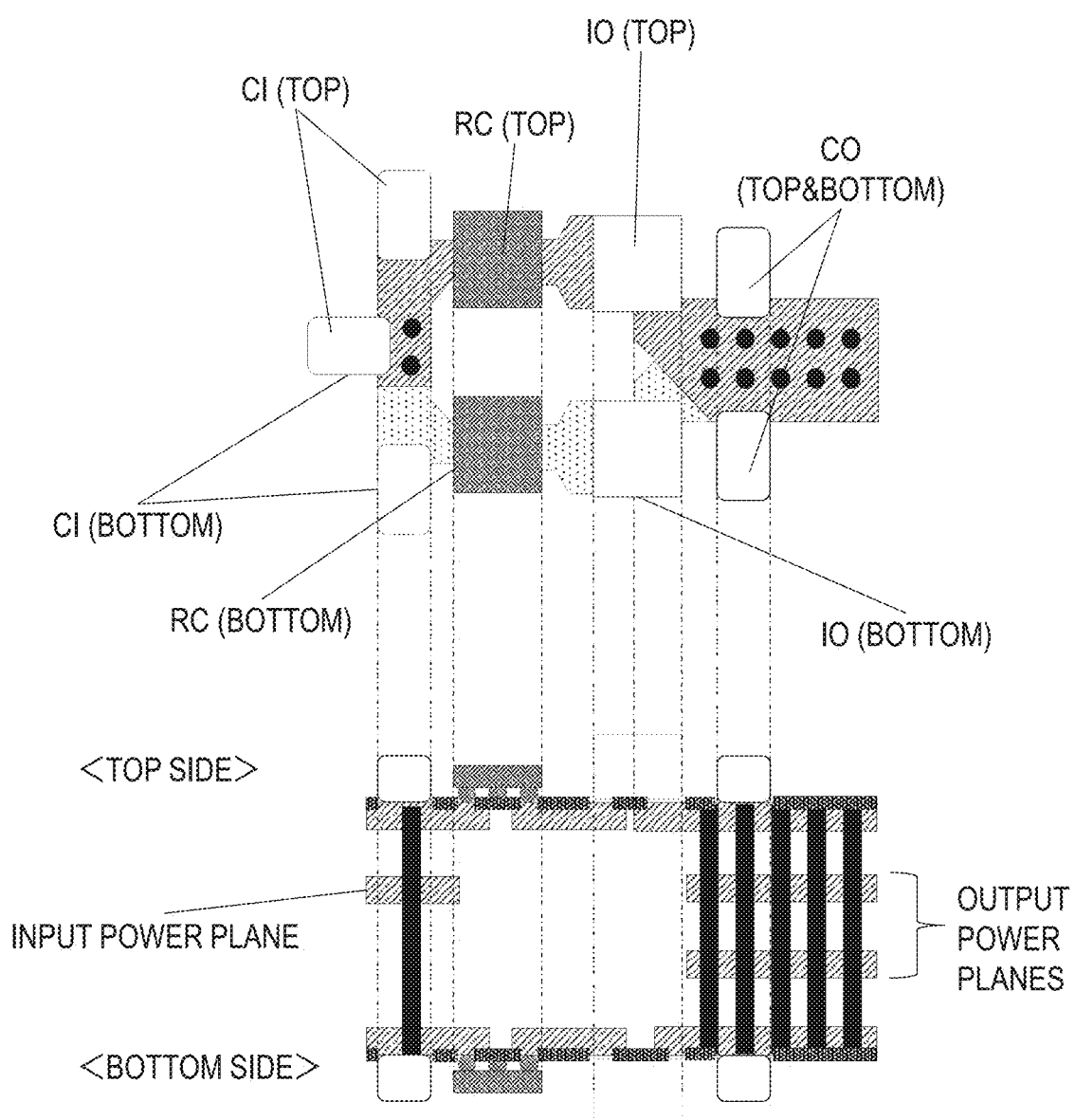
FIG. 4 is a diagram showing a plane and a cross section with respect to the component arrangement of the regulator circuit according to an embodiment.

FIG. 4 is a diagram showing a plane and a cross section with respect to the component arrangement of the regulator circuit according 70 an embodiment. In FIG. 4, the switching regulator SWR1 and the switching regulator SWR3, in a plan view, the transmission plan view and cross-sectional view in the configuration example when arranged offset is shown. As shown in FIG. 4, it is possible to reduce the wiring area of the components (SWR1, CI, LO and CO) arranged on the front surface (TOP SIDE) and the wiring area of the components (SWR3, CI, LO and CO) arranged on the back surface (BOTTOM SIDE) with some degree of freedom in the front and back surfaces. In this case, in order to share two THs (COMMON TH (INPUT) and COMMON TH(OUTPUT)) on the front and back surfaces, it is required to place the respective components ((SWR1, CI, LO, CO) and (SWR3, CI, LO, CO)) so as to be close to the TH (COMMON TH(INPUT), COMMON TH (OUTPUT) in each of the front surface (TOP SIDE) and the back surface (BOTTOM SIDE).

Figure 5:
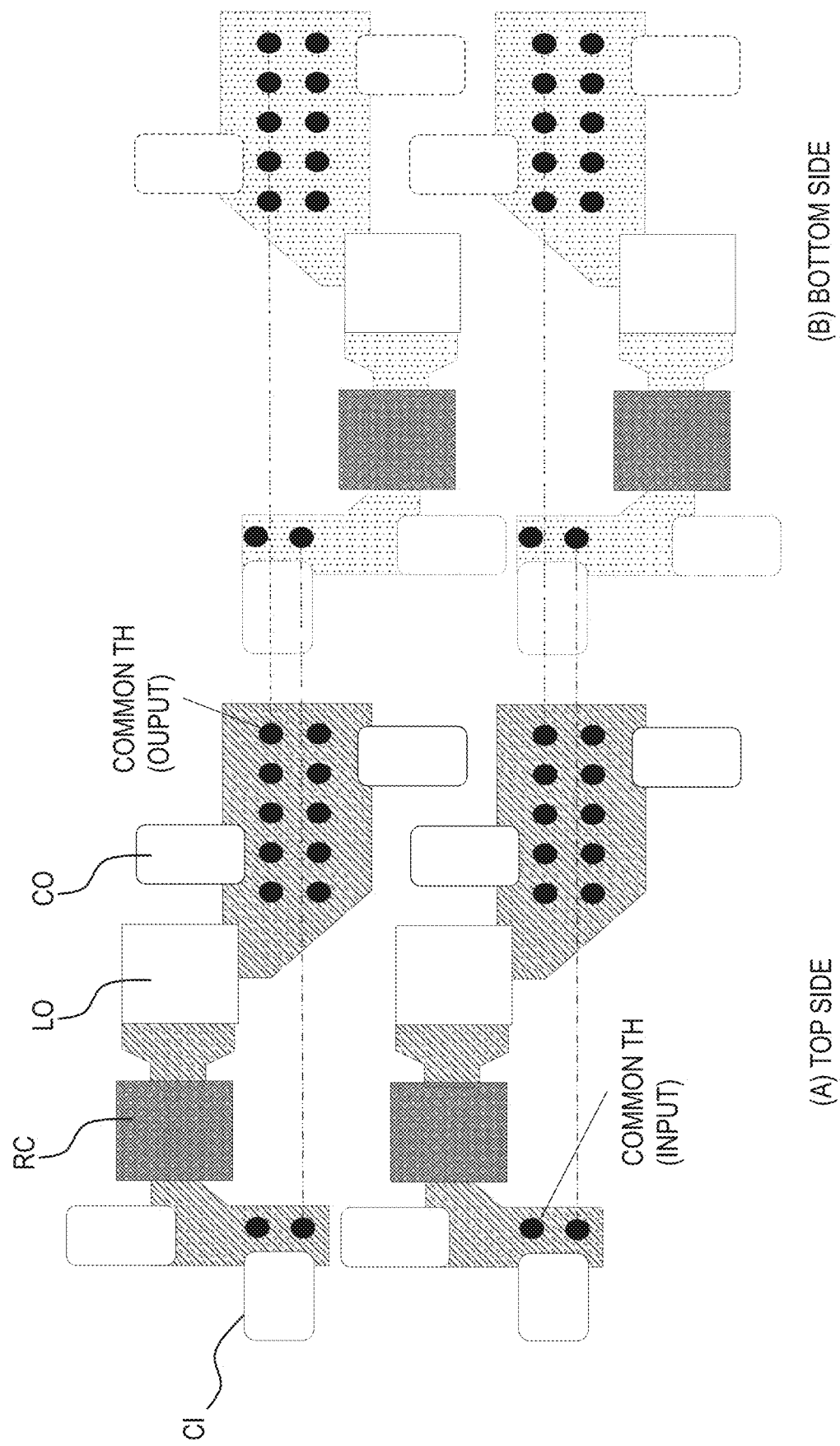
FIG. 5 is a diagram showing a plan view with respect to the component arrangement of the regulator circuit according to an embodiment.

FIG. 5 is a diagram showing a plan view with respect to the component arrangement of the regulator circuit according to an embodiment. FIG. 5 shows an exemplary arrangement of four switching regulators SWR1-SWR4 when using the configuration example of FIG. 4. It shows plan view on the front surface (TOP SIDE) and plan view when the back surface (BOTTOM SIDE) from above. Specifically, as shown in FIG. 5, the input capacitor CI and the switching regulator SWR1-SWR4 are disposed close to the TH (COMMON TH (INPUT)) electrically connected to the input power supply pattern (INPUT POWER PLANE) of the inner layer. The output inductor LO and the output capacitor CO by placing close to the TH (COMMON TH (OUTPUT)) electrically connected to the output power supply pattern (OUTPUT POWER PLANE) of the inner layer. By these arrangement, the arrangement wiring area can be minimized on both front and back surface.

(Operation of Switching Regulator)

Figure 6:
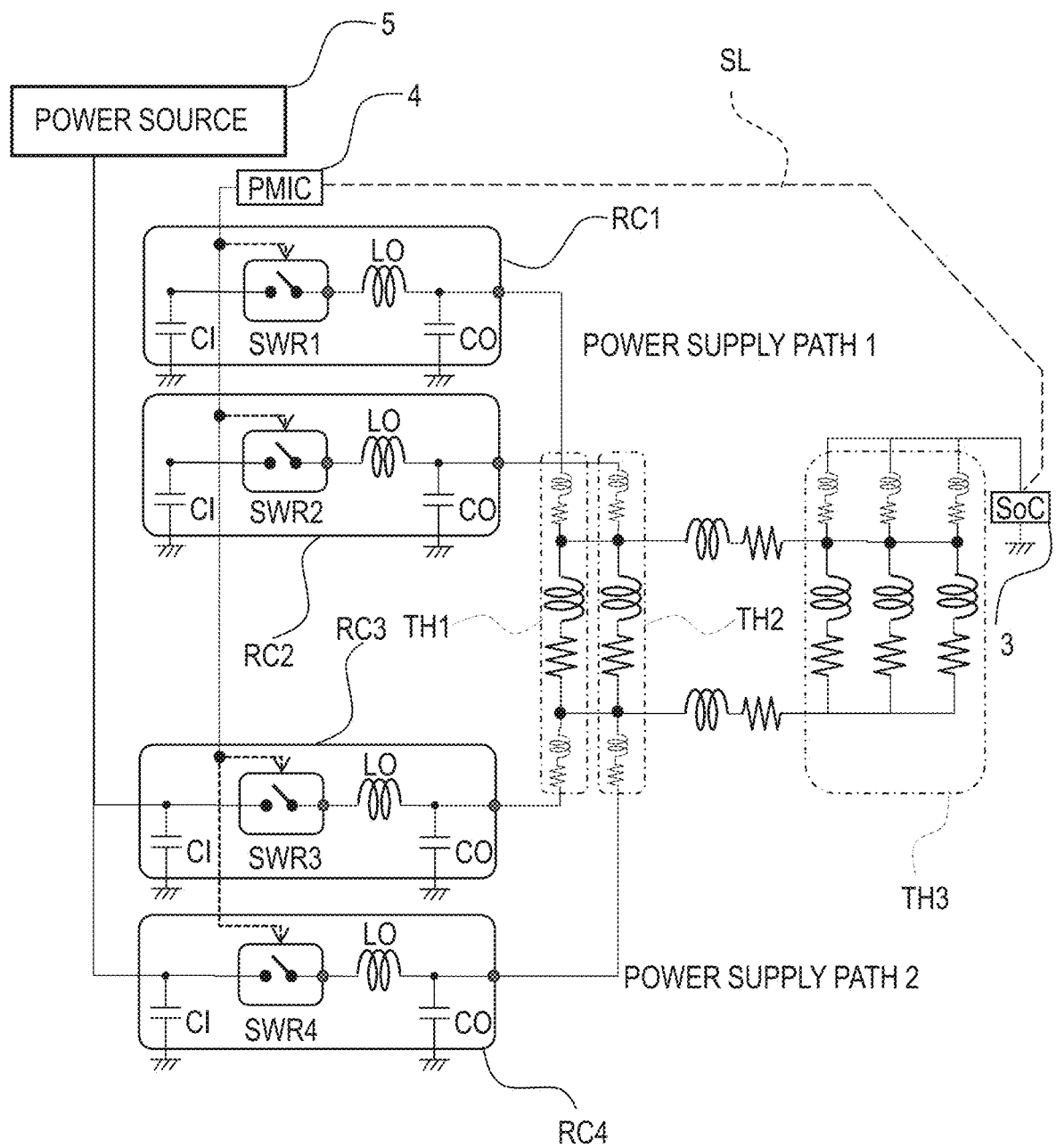
FIG. 6 is a block diagram showing the control of the switching regulator in the regulator circuit according to an embodiment.
Figure 7:
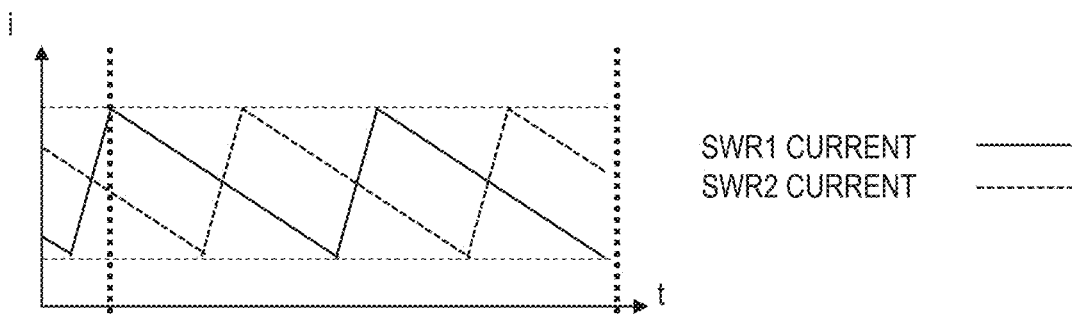
FIG. 7 is a chart showing the control of the switching regulator in the regulator circuit according to an embodiment.
Figure 7:
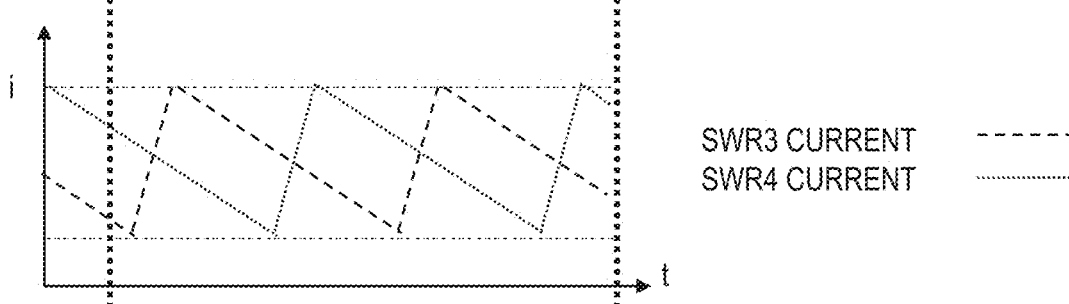
Figure 7:
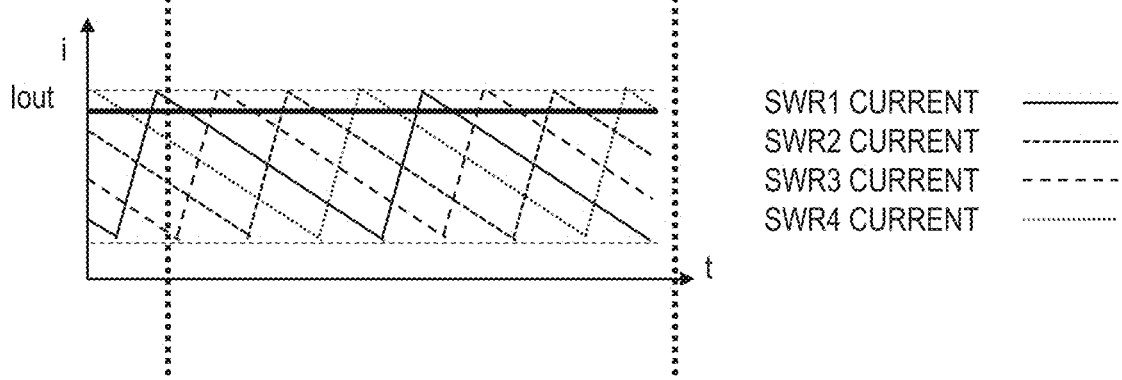

Next, an operation example of the regulator circuit RC according to present embodiment will be described with reference to FIGS. 6 and 7. FIG. 6 is a block diagram showing the control of the switching regulator the regulator circuit according to an embodiment. FIG. 7 is a chart showing the control of the switching regulator in the regulator circuit according to an embodiment. Incidentally, in FIG. 6, as a regulator circuit RC, a regulator circuit RC1 including a switching regulator SWR1, a regulator circuit RC2 including a switching regulator SWR2, a regulator circuit RC3 including a switching regulator SWR3, and a regulator circuit RC4 including switching regulator SWR4 depicted. In FIG. 7, the waveforms of the output current of the switching regulators SWR1-SWR4 is depicted as charts (A), (B), (C).

As shown in FIG. 6, PMIC 4 observes the potential in the vicinity of the power supply terminal of SoC 3 is a load by the sense line SL, and outputs a current by controlling the switching regulators SWR1-SWR4 so that the potential is constant. When generating a single power supply in four switching regulators SWR1-SWR4, the phase of the output power supply (output current) ¼, i.e., so as to suppress the ripple of the output current by shifting each other by 90°. Specifically, as shown in FIG. 6, with respect to the period of the control signal for one switching regulator, by outputting a control signal of PMIC4 in a period of four times, sequentially controlling the four switching regulators SWR1-SWR4.

As shown in chart (A) of FIG. 7, the switching regulators SWR1 and SWR2 located on the front surface (TOP SIDE) displace the phases of the output power supply (output current) by 180° from each other, respectively. Similarly, as shown in chart (B) of FIG. 7, the switching regulators SWR3 and SWR4 disposed on the rear surface (BOTTOM SIDE) shifts the phases of the output power supply (output current) to each other 180°. Furthermore, as shown in charts (A) and (B) FIG. 7, the switching regulators SWR1 and SWR3 which are arranged on opposing surfaces to share THs shifts the phase of the output power supply (output current) by 90° from each other. Similarly, the switching regulators SWR2 and SWR4 also shift the phase of the output power supply (output current) by 90° from each other. Chart (C) of FIG. 7 shows a current waveform of the switching regulators SWR1-SWR4 obtained by combining chart (A) and chart (B). In chart (C), the output current Iout shows a smoothed output current of the switching regulators SWR1-SWR4.

The PMIC 4 generates a control signal so as to shift the phase of the output power supply generated by the first switching regulator group (switching regulators SWR1 and SWR2) by 180° from each other and generates a control signal so as to shift the phase of the output power supply generated by the second switching regulator group (switching regulators SWR3 and SWR4) by 180° from each other. Further, the PMIC 4 generates a control signal such that the phase of the output power supply generated by the first switching regulator group (switching regulator SWR1 and SWR2) and the phase of the output power supply generated by the second switching regulator group (switching regulator SWR3 and SWR4) are shifted by 90°.

When the switching regulator SWR1 and SWR2 provide current, current flows primarily through the supply path (Power Supply Path1) 10 shown in FIG. 6 to SoC 3. Since the inductance and resistance of the TH inhibits the flow of current, supply path (Power Supply Path2) 20 in the lower layer of the system board 1, the current is less likely to flow compared to the supply path (Power Supply Path1) 10.

When the switching regulator SWR3 and SWR4 provide current, current flows primarily through the supply path (Power Supply Path2) 20 shown in FIG. 6 to SoC 3. As shown in FIG. 6, via the through-hole group TH1 and the through-hole group TH2, a current flows through the feed path (Power Supply Path1) 10. Compared to the through-hole group TH1 and the through-hole group TH2, the through-hole group TH3 just below SoC 3 has many THs and impedance is suppressed low. Therefore, the supply path of the main current becomes the supply path (Power Supply Path2) 20. Incidentally, TH number of the through-hole group TH3 is increased in order to the same number as the number of power supply terminals of SoC 3.

Effects in Present Embodiment

It is possible to reduce the area required for arrangement and wiring by placing the regulator circuit RC on both surfaces of the front surface (TOP SIDE) and the back surface (BOTTOM SIDE) of the system board 1.

In addition, a power supply pattern serving as a power supply path is formed in a plurality of inner layers (INNER LAYER METAL PATTERN) of the system board 1. The TH (COMMON TH (OUTPUT)) electrically connecting the output pattern of the regulator circuit RC of the surface layer (OUTER LAYER METAL PATTERN) and the power supply pattern of the inner layer (INNER LAYER METAL PATTERN) is shared by the regulator circuit RC of both sides. These make it possible to reduce the number of TH required. Furthermore, it is possible to reduce the arrangement area of the TH.

The amount of current that can flow per TH is limited by the calorific value determined by the material and size. Therefore, the necessary number of THs is determined by the upper limit current value. For example, in the case of 0.8 A per TH, a total of 100 THs including 50 power supply THs and 50 GND THs are required to flow current 40 A.

By arranging the regulator circuit RC on both the front and back surfaces of the system board 1, one shared TH can be separated from the supply path 10 to be connected to the power supply pattern from the regulator circuit RC (RC1, RC2) disposed on the front surface (TOP) via TH and the supply path 20 to be connected to the power supply pattern from the regulator circuit RC (RC3,RC4) disposed on the rear surface (BOTTOM) via TH. Specifically, the current output from the regulator circuits RC1, RC2 of the front surface flows mainly into the power supply pattern of the inner layer flows from the upper end of the TH (COMMON TH (OUTPUT)), the current output from the regulator circuits RC3, RC4 of the rear surface flows from the lower end of the TH (COMMON TH (OUTPUT) flows into the power supply pattern of the inner layer, both main paths are separated on TH (COMMON TH (OUTPUT)), it is possible to reduce the required number of TH by half.

Further, in the power supply pattern of the large-current power supply, in order to suppress a voltage drop due to the resistor component, a cross-sectional area of the conductor is secured by forming a plurality of layers of power supply patterns in the inner layer of the system board 1. At this time, the power supply current generated by the regulator circuit RC on the surface of the system board 1 flows through the TH to the plane of the inner layer. Since TH has an inductance component and a resistance component, compared to the layer close to the regulator circuit RC, the far layer by reciprocating TH, the impedance is increased, the current flowing in the plane of the far layer becomes small.

When the regulator circuit RC is mounted on both surfaces the front surface (TOP SIDE) and the rear surface (BOTTOM SIDE) of the system board 1, the current of the regulator circuit RC (RC1,RC2) mounted on the front surface (TOP SIDE) flows through the power supply pattern of the inner layer close to the front surface (TOP SIDE), and the current of the regulator circuit RC (RC3,RC4) mounted on the back surface (BOTTOM SIDE) flows through the power supply pattern of the inner layer close to the back surface (BOTTOM SIDE). Therefore, the amount of current that can be rubbed per conductor cross-sectional area is increased. In addition, since the main power supply pattern can also be separated layer by layer, it is possible to alleviate the current upper limit due to heat generation.

Further, since the regulator circuit RC is one of the heat source in the system, by mounting the regulator circuit RC on the front and rear surfaces of the system board 1, it is possible to separate the heat dissipation path into two. In general system boards, regulator circuits RC, SoCs, high-speed memories, etc. are concentrated on one side of the system board, so that countermeasures such as adopting a fan of a good conductivity material and a high capacity are required for the heat exhaust mechanism, resulting in an increase in cost. In semiconductor device according to the embodiment, by separating the heat radiation path by dispersing the heat generation source, it is possible to simplify the exhaust heat mechanism. Consequently, semiconductor device can be reduced.

(Effect of Reducing the Number of Parts)

By operating the switching regulators SWR ((SWR1 and SWR2) or (SWR3 and SWR4)) constituting the regulator circuits RC (RC1-RC4) disposed on the same surface of each of the front and back surfaces of the system board 1 by shifting the 180° phase (that is, by shifting the half cycle), it is possible to reduce the number of components by partially sharing the input capacitor CI and the output capacitor CO required for each of the regulator circuit RC.

Figure 8:
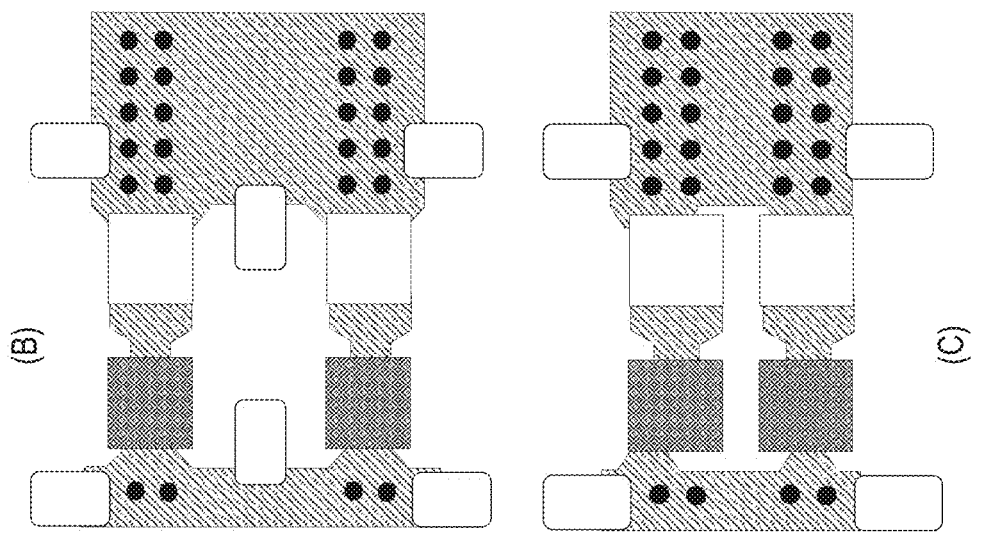
FIG. 8 is a diagram showing the effect of reducing the number of components of the switching regulator in the regulator circuit according to an embodiment.
Figure 8:
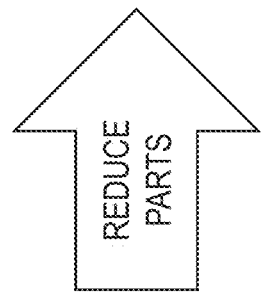
Figure 8:
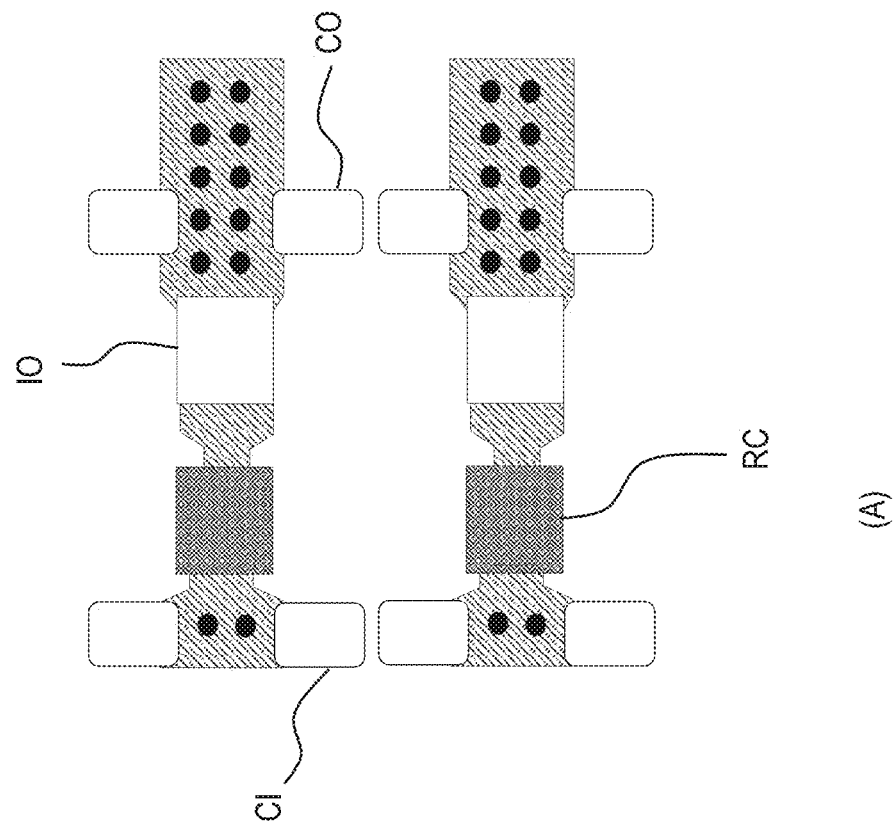

FIG. 8 is a diagram showing the effect of reducing the number of components of the switching regulator in the regulator circuit according to an embodiment. As shown in FIG. 8, the input capacitor CI is a component that guarantees the potential at the moment when the regulator circuit RC turns ON. The output capacitor CO is a component in which the regulator circuit RC guarantees the potential during the period of OFF. Therefore, the capacitor capacitance required to ON/OFF the two regulator circuits alternately can ideally be reduced to about one regulator circuit for both the input capacitor CI and the output capacitor CO. The arrangement example (A) of FIG. 8 shows the plan view front surface of the regulator circuit RC of FIG. 2. On the front surface side, four input capacitors CI and four output capacitors CO are provided. Similarly, on the back surface side, four input capacitors CI and four output capacitors CO are provided. That is, in the regulator circuit RC of FIG. 2, eight input capacitors CI and eight output capacitors CO is utilized.

The arrangement examples (B) and (C) of FIG. 8 show an example layout arrangement of the regulator circuit RC when the number of input capacitors CI and the number of output capacitors CO is reduced.

In the arrangement example (B), on the front surface side, three input capacitors CI and three output capacitors CO are provided. Similarly, on the back surface side, three input capacitors CI and three output capacitors CO are provided. That is, in the arrangement example (B), as compared with the arrangement example (A), a total of four components of two input capacitors CI and two output capacitors CO can be reduced.

In the arrangement example (C), on the surface side, two input capacitors CI and two output capacitors CO are provided. Similarly, on the back side, two input capacitors CI and two output capacitors CO are provided. That is, in the arrangement example (C), as compared with the arrangement example (A), a total of eight components of four input capacitors CI and four output capacitors CO can be reduced.

Figure 9A:
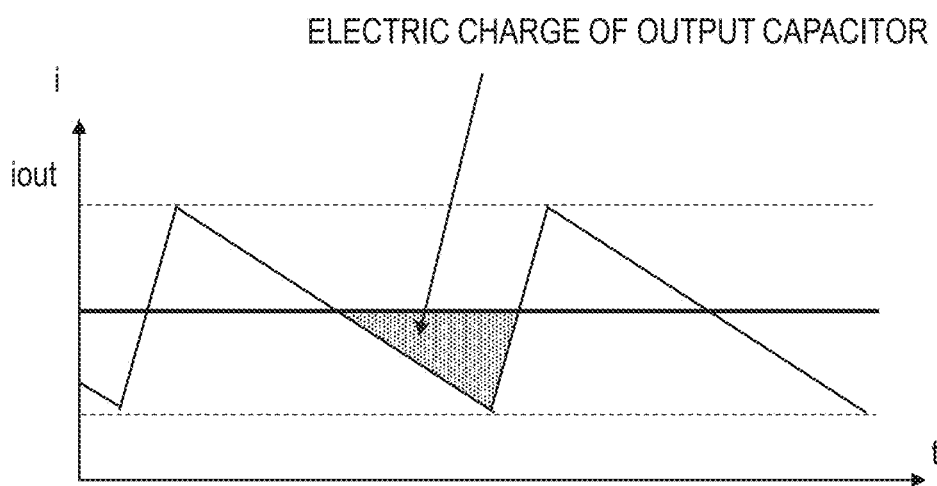
FIG. 9A is a time chart showing a control example of two switching regulators in the regulator circuit according to an embodiment.
Figure 9B:
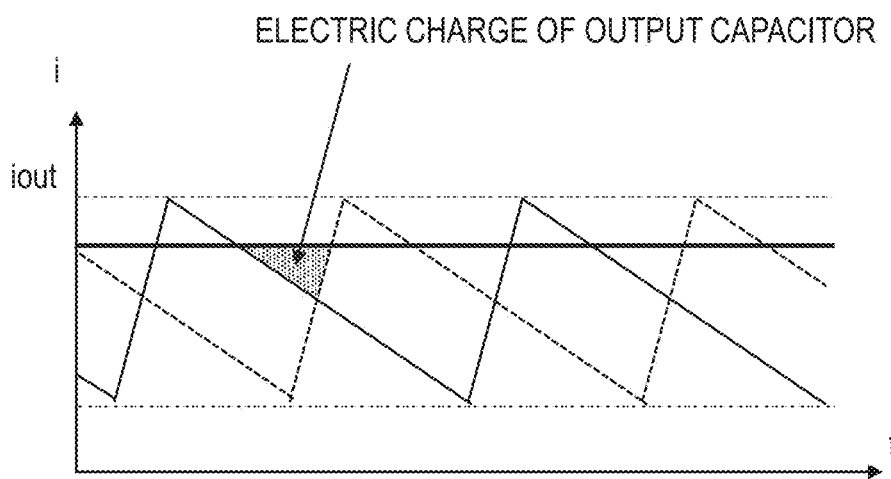
FIG. 9B is a time chart showing another control example of two switching regulators in the regulator circuit according to an embodiment.

FIG. 9A is a time chart showing a control example of two regulator circuits according to an embodiment. FIG. 9B is a time chart showing another control example of the two regulator circuits according to an embodiment. FIG. 9A shows, for example, a waveform of the output current when the regulator circuits RC1 and RC2 is operated ON/OFF in the same phase. On the other hand, FIG. 9B, for example, a waveform of the output current when ON/OFF operation by shifting the regulator circuits RC1 and RC2 by 180° phase is shown. Here, in FIG. 9A and FIG. 9B, the capacitor capacitance required to ON/OFF the two regulator circuits alternately is shown by the area of the hatched portion. Compared to the area of the hatched portion shown in FIG. 9A, the area of the hatched portion of FIG. 9B is reduced. FIG. 9B indicates that the required capacitor capacitance is small. Therefore, as shown in FIG. 9B, it is shown that the number of capacitors can be reduced when the regulator circuits RC1 and RC2 are ON/OFF operated by shifting the phase by 180°.

That is, as shown in the chart (C) of FIG. 7, when operating the four regulator circuits RC1-RC4, it is possible to reduce the number of capacitors. For example, when using the same capacitor component of the capacitance value, from the arrangement example (A) of FIG. 8, as in the arrangement example (B) and arrangement example (C) of FIG. 8, it is possible to reduce the number of components of the capacitor.

As shown in FIG. 9A and FIG. 9B, the capacitor can be effectively placed close to the target to guarantee the potential. Considering the arrangement relationship between the input terminal and the input capacitor CI of the regulator circuit RC, the output inductor LO and the output capacitor CO and the shared TH, arrangement example (B) and arrangement example (C) of FIG. 8, since it is possible to share the capacitor between the regulator circuits RCs, it is an optimal arrangement that can reduce the number of components while ensuring the electrical characteristics.

First Modified Example

In the inner layer power supply pattern connecting the power supply terminals of the regulator circuit RC and SoC 3, the power supply path is different for each layer, aid the terminals of the power supply destination are also different for each layer.

Figure 10:
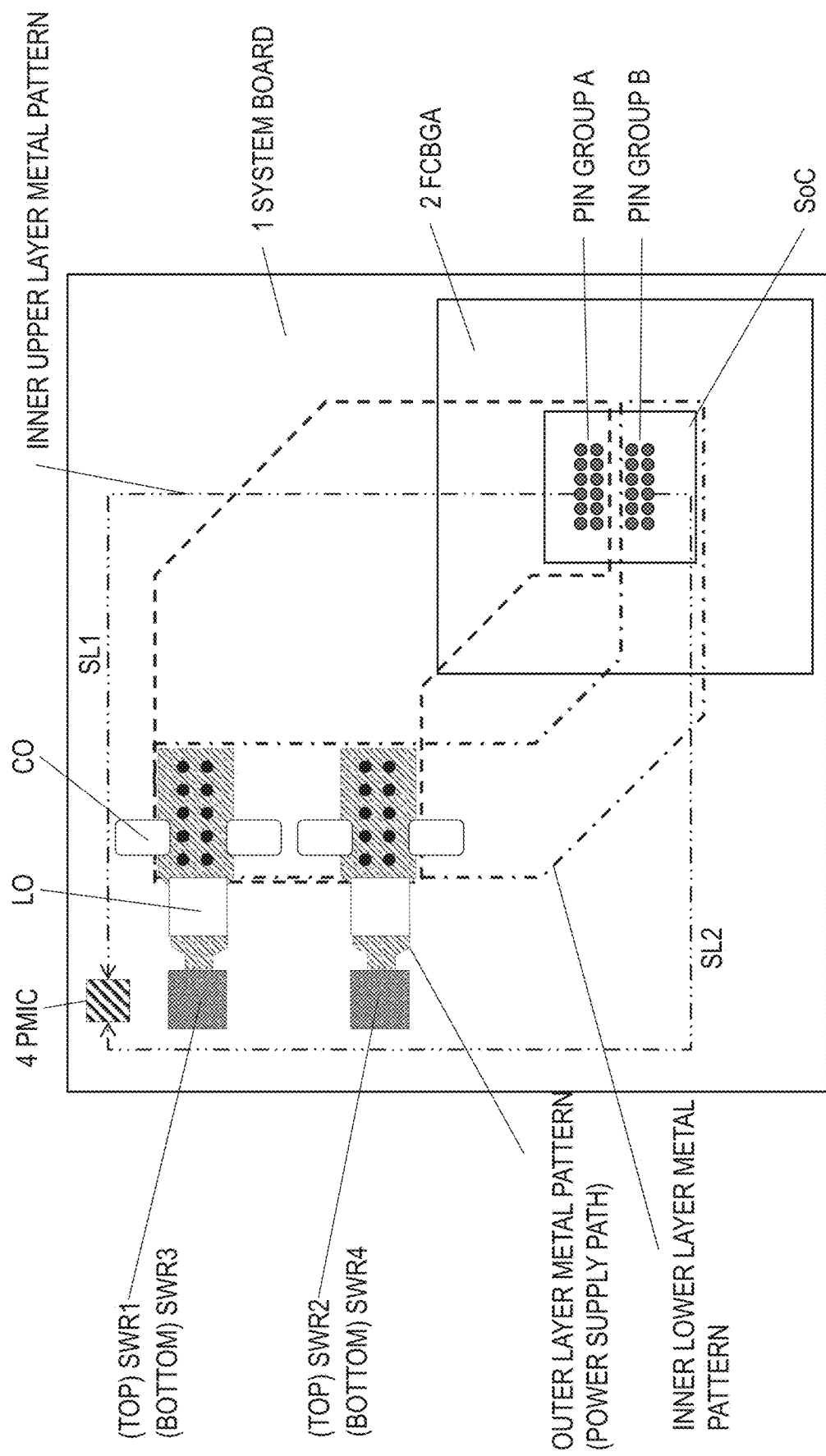
FIG. 10 is a diagram illustrating a configuration of a semiconductor device according to first modified example of an embodiment.

FIG. 10 is a diagram illustrating a configuration of a semiconductor device according to first modified example of an embodiment. As shown in FIG. 10, the switching regulators (SWR1 and SWR2) mounted on the front surface layer (TOP SIDE) on the system board 1 use the power supply patterns (INNER UPPER LAYER METAL PATTERN) of the upper layer close to the surface as main power supply paths. The switching regulators (SWR3 and SWR4) mounted on the back surface layer (BOTTOM) on the system board 1 uses the power supply patterns (INNER LOWER LAYER METAL PATTERN) of the lower layer close to the back surface as main power supply paths. The power supply pattern of the upper layer (INNER UPPER LAYER METAL PATTERN) is electrically connected to the power supply terminal group A (Pin Group A) and the power supply pattern of the lower layer (INNER LOWER LAYER METAL PATTERN) is electrically connected to the power supply terminal group B (Pin Group B).

The power supply terminal group A (Pin Group A) and the power supply terminal group B (Pin Group B) are electrically connected to the observation wiring SL1 and the observation wiring SL2, respectively, for transmitting the potential in the vicinity of the power supply terminal of SoC 3 to PMIC 4. These observation wire SL1 and SL2 are electrically connected to PMIC 4 by a wire provided as a path separate from the power supply pattern.

Operation of First Modified Example

Figure 11:
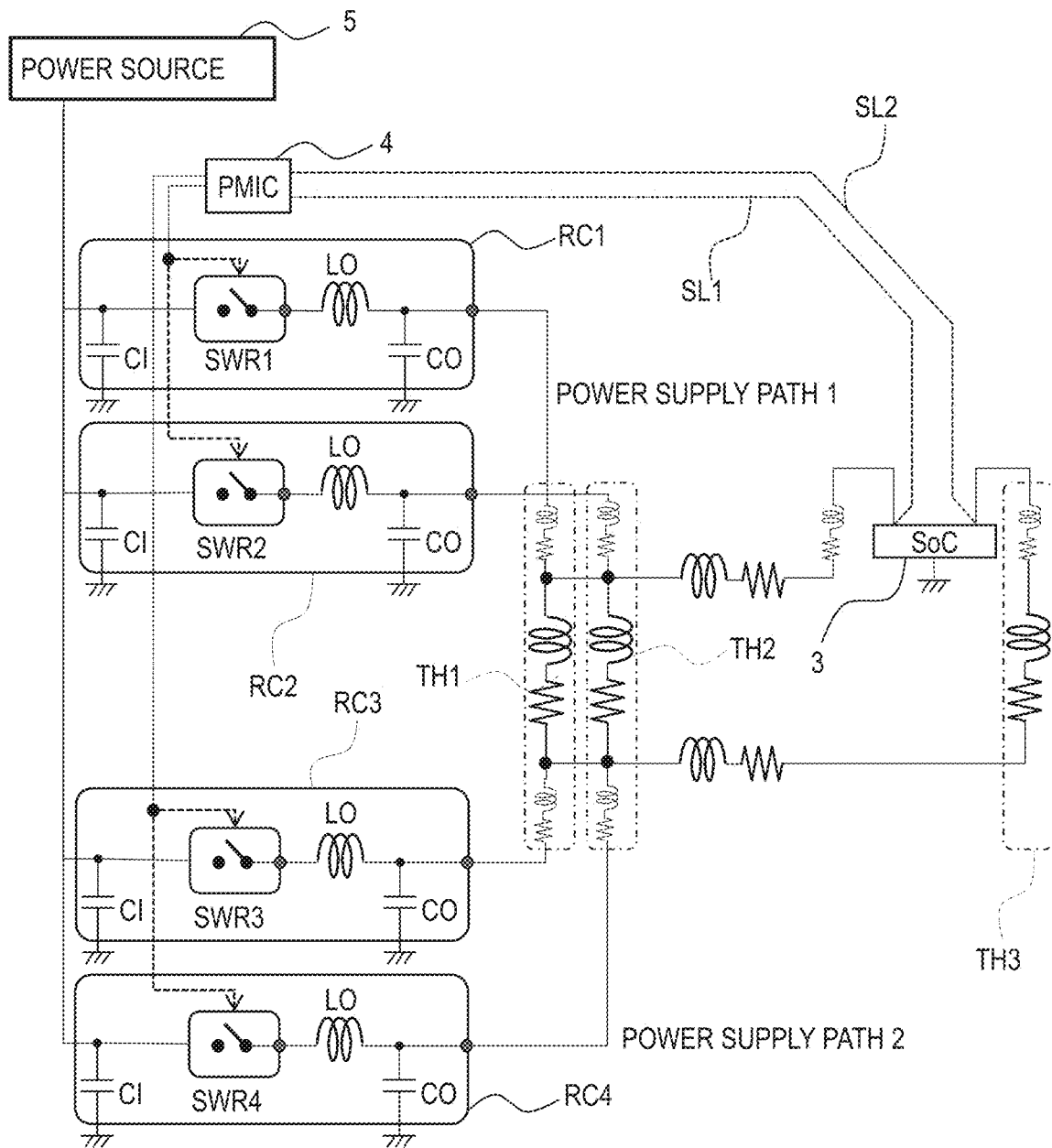
FIG. 11 is a block diagram of a regulator circuit according to first modified example of an embodiment.

FIG. 11 is a block diagram of a regulator circuit according to first modified example of an embodiment. As shown in FIG. 11, the observation wiring SL1 and the observation wiring SL2 of the power supply terminal group A (Pin Group A) and the power supply terminal group B (Pin Group B) is electrically connected to PMIC 4. The PMIC 4 controls so as to suppress the variation of the output potential of the regulator circuits RC1 and RC2 by observing the potential of the observation wiring SL1, and controls so as to suppress the variation of the output potential of the regulator circuits RC3 and RC4 by observing the potential of the observation wiring SL2.

Effect of First Modified Example

Since so as to separate the power supply destination for each arrangement layer of the inner layer power supply pattern is the power supply path of first embodiment, it is possible to stabilize the supply power.

Specifically, since the power supply pattern becomes slender in the vicinity of the SoC 3, by connecting the power supply terminal group (power terminal group A (Pin Group A) and the power supply terminal group B (Pin Group B)) to the power supply pattern (upper layer of the power supply pattern (INNER UPPER LAYER METAL PATTERN) and the lower layer of the power supply pattern (INNER LOWER LAYER METAL PATTERN)) from a suitable direction, is possible to suppress the impedance and resistance components. In the vicinity of SoC 3, it is impossible to secure a large power pattern width, the resistor and impedance of the power supply pattern becomes large. This is because the terminal spacing of SoC3 is small and dense, wiring and TB are dense to connect a number of signal terminals and a plurality of types of power supply terminals to the other components of the system board 1. Therefore, when pulling the power supply pattern to SoC3 from one direction, the potential of the respective terminals is changed by the terminal arrangement of SoC 3.

For example, when connecting to the power supply terminal group A and the power supply terminal group B (Pin Group A, B) from the regulator circuit RC, to the outer peripheral terminal in front when viewed from the direction of connecting the power pattern can be widely ensured power pattern width. However, the terminal on the rear side will become narrower power pattern width becomes a hole in the power pattern in TH, further power supply distance becomes longer. Therefore, the potential drop due to the resistor component becomes large. By dividing the terminal group of SoC 3 and supplying power from each optimum orientation, it is possible to suppress a decrease in the voltage.

In addition, in first modified example, supply paths of first embodiment are separated. As a result, first modified example has greater flexibility of wiring and improved wiring efficiency, so the number of layers and area are reduced.

Specifically, when exclusively having the same path over two layers in the power supply pattern, it becomes difficult to provide other wiring (e.g., observation wirings SL1 and SL2) in the region. This is due to the fact that the signal terminals of SoC 3 are arranged on the four sides of SoC 3, and the input and output (IO) power supplies that drive the respective signals accordingly are also arranged on the four sides of SoC 3. At this time, as shown in FIG. 10, when the connecting directions to SoC 3 of the two layer power supply pattern are different, and the power supply pattern paths leading to there are also different, even in an area where the power supply pattern, it is possible to place the other wiring in one layer.

Furthermore, in first modified example, by separating the observation line SL in the vicinity of SoC 3 of first embodiment for each power supply path (providing the observation line SL1,SL2), it is possible to finely control the amount of current, it is possible to stabilize the operation of SoC 3. As the power consumption of SoC 3 increases, the power supply control inside SoC 3 becomes finer. For example, when one CPU core is operated, when the four CPU cores are operated, when the image processing circuit is operated, the power switch and the GND switch inside SoC 3 functions to switch ON/OFF of the power supply for each circuit to be used. Therefore, SoC 3 may require current locally, the current is concentrated in the power supply terminal group close to the circuit requiring current.

By individually measuring the power supply potential of each power feed destination in one PMIC 4 with the observation wiring (SL1 and SL2), the power supply terminal group A and the power supply terminal group B can cope with the local current variation by using the optimal regulator circuit RC while keeping the same potential.

Second Modified Example

Figure 12:
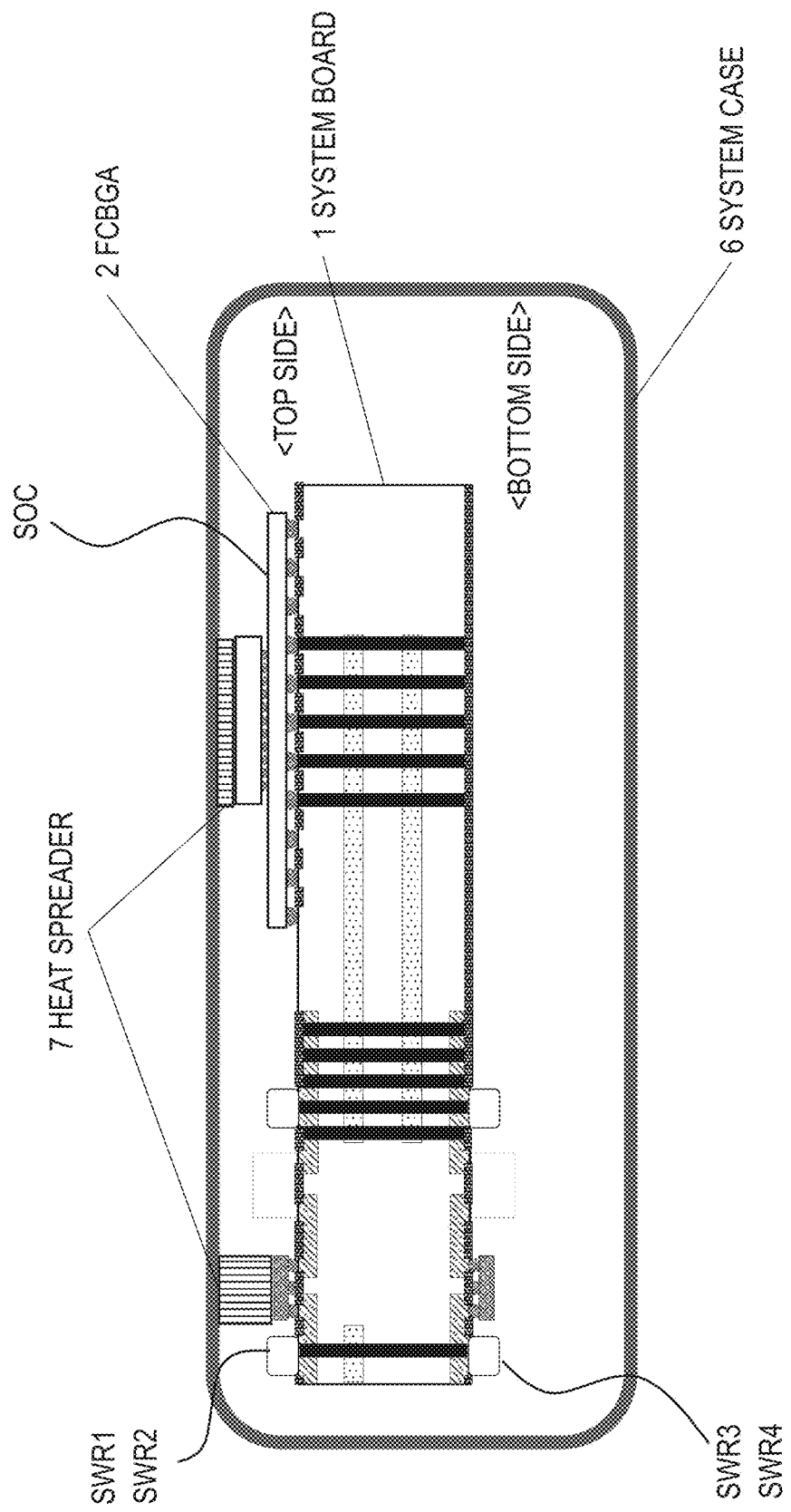
FIG. 12 is a cross-sectional view of a regulator circuit according to second modified example of an embodiment.

FIG. 12 is a cross-sectional view of a regulator circuit according to second modified example of an embodiment. In second modified example, the switching regulators SWR1 and SWR2 are provided on the front surface of the system board 1 and the switching regulators SWR3 and SWR4 are provided on the back surface of the system board 1. It is possible to change the performance of the regulator circuit by the units of the switching regulators SWR1 and SWR2 and the units of the switching regulators SWR3 and SWR4. Each of the switching regulators SWR1-SWR4 supplies the same power as first embodiment and first modified example.

When physically reducing the concentration of the heat source and reducing the cost of the heat dissipation mechanism, the output current of the switching regulators SWR1 and SWR2 in first embodiment and the output current of the switching regulators SWR3 and SWR4 should be different. FIG. 12 shows cross-sectional view of semiconductor device 100 provided inside the system case 6. As shown in FIG. 12, on the front surface side of the system board 1, a switching regulators SWR1 and SWR2 and a FCBGA packaging 2 having SoC 3 are arranged. Between the switching regulators (SWR1 and SWR2) and the system case 6, and between each of SoC 3 and the system case 6, three radiators (HEAT SPREDER) 7 as a heat dissipating mechanism heat dissipating component are provided, the heat generated from the switching regulators (SWR1 and SWR2) and SoC 3 through the three radiators 7, is adapted to be radiated to the system case 6.

Specifically, as shown in FIG. 12, switching regulators (SWR3 and SWR4) are components with smaller output current than the switching regulators (SWR1 and SWR2). Thus, the calorific value of the back surface of the system board 1 is reduced as compared with the calorific value of the front surface on which switching regulators SWR1 and SWR2 are arranged. Thus, it is possible to eliminate the need for installation of the radiator 7 as a heat radiating mechanism on the back surface of the system board 1. By comparing the current value of the switching regulators (SWR1 and SWR2) with the current value of the switching regulators (SWR3 and SWR4), a heat dissipating component is placed on the surface of the system board 1 in which the switching regulator group having higher current value is arranged.

According to second modified example, the heat radiating mechanism provided on the system board 1 (radiator 7) can be reduced by the amount of the regulator circuit RC disposed on the back surface.

Third Modified Example

Figure 13:
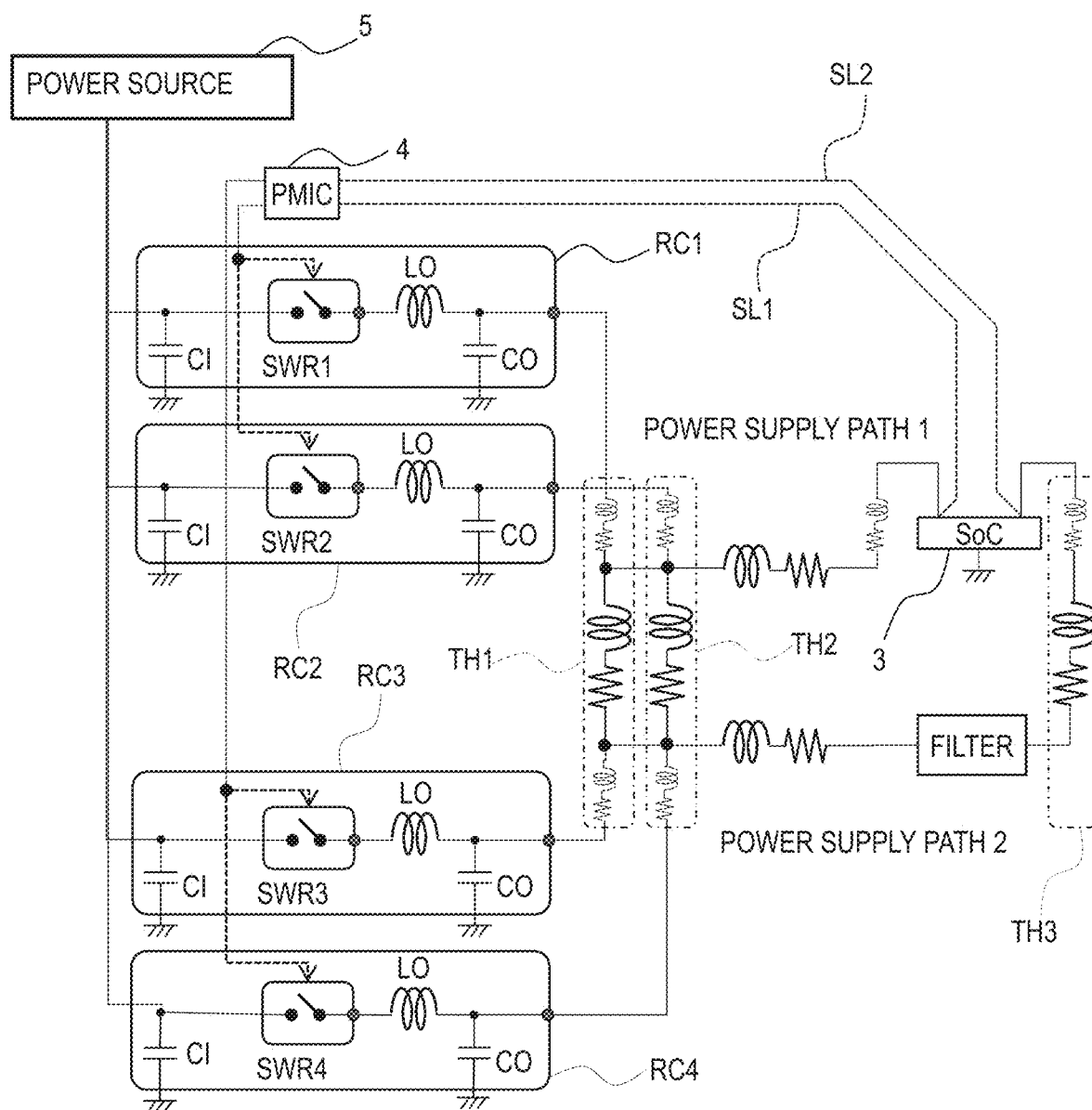
FIG. 13 is a block diagram showing a regulator circuit according to third modified example of an embodiment.

FIG. 13 is a block diagram showing a regulator circuit according to third modified example. FIG. 13 is different from FIG. 11 in that filter (FILTER) is provided in the power supply path (Power Supply Path2). In SoC 3 as the power supply destination, as shown in FIG. 10, since there are the power supply terminal group A and the power supply terminal group B with the same potential (PIN GROUP A, PIN GROUP B), in order to avoid the inflow of power noise to the power supply terminal group A, filter (FILTER) such as a low-pass filter is connected to the power supply path connected to the power supply terminal group B (Power Supply Path2).

While the invention made by the present inventor has been specifically described above based on the embodiment, the present invention is not limited to the above-described embodiment and Embodiment, and it is needless to say that the present invention can be variously modified.

What is claimed is:

1. A semiconductor device comprising:
    a regulator circuit including:
        an even number of switching regulators for generating an output power supply from an input power supply; and
        a power management IC for controlling output potentials generated by the even number of switching regulators,
    wherein a first switching regulator group including a half of the even number of switching regulators is disposed on a first surface of a system board of the semiconductor device,
    wherein a second switching regulator group including a remaining half of the even number of switching regulators is disposed on a second surface of the system board of the semiconductor device, and
    wherein the first surface and the second surface of the semiconductor device are arranged to have a front-back relationship.

2. The semiconductor device according to claim 1, wherein the first switching regulator group disposed on the first surface and the second switching regulator group disposed on the second surface are arranged so as to overlap in a plan view.

3. The semiconductor device according to claim 1, further comprising a plurality of through holes penetrating the system board,
    wherein the plurality of through holes comprises:
        a first through hole group used by the first switching regulator group; and
        a second through hole group used by the second switching regulator group.

4. The semiconductor device according to claim 3,
    wherein the first switching regulator group is disposed proximate to the first through hole group, and
    wherein the second switching regulator group is disposed proximate to the second through hole group.

5. The semiconductor device according to claim 1,
    wherein the power management IC shifts a phase of the output power supply generated by the first switching regulator group by 180° each other, and
    wherein the power management IC further shifts a phase of the output power supply generated by the second switching regulator group by 180° each other.

6. The semiconductor device according to claim 5, wherein the power management IC shifts the phase of the output power supply generated by the first switching regulator group and the phase of the output power supply generated by the second switching regulator group are shifted by 90°.

7. The semiconductor device according to claim 1, wherein the power management IC the first switching regulator group and the second switching regulator group such that a first current value generated by the first switching regulator group and a second current value generated by the second switching regulator group are different from each other.

8. The semiconductor device according to claim 7, wherein radiators are arranged on a surface of one of the first switching regulator group or the second switching regulator having a higher current value than another.

9. A semiconductor device comprising:
System-On-Chip (SoC); and
a regulator circuit having:
    an even number of switching regulators for generating an output power supply from an input power supply; and
    a power management IC for controlling output potentials generated by the even number of switching regulators,
wherein a first switching regulator group including a half of the even number of switching regulators is disposed on a first surface of a system board of the semiconductor device,
wherein a second switching regulator group including a remaining half of the even number of switching regulators is disposed on a second surface of the system board of the semiconductor device,
wherein the first surface and the second surface are arranged to have a front-back relationship with each other, and
wherein a first power supply pattern provided in a layer close to the first surface, a second power supply pattern provided in a layer close to the second surface and the first switching regulator group are electrically connected to power supply terminals of the SoC via the first power supply pattern.

10. The semiconductor device according to claim 9, wherein the first switching regulator group disposed on the first surface and the second switching regulator group disposed on the second surface are arranged to overlap in a plan view.

11. The semiconductor device according to claim 9,
wherein the power management IC shifts a phase of the output power supply generated by the first switching regulator group by 180° each other, and
wherein the power management IC shifts a phase of the output power supply generated by the second group of switching regulators is shifted 180° each other.

12. The semiconductor device according to claim 11, wherein the power management IC shifts the phase of the output power supply generated by the first switching regulator group and the phase of the output power supply generated by the second switching regulator group are shifted by 90°.

13. A power management IC for controlling an even number of switching regulators,
wherein a first switching regulator group including a half of the even number of switching regulators is disposed on a first surface of system board of a semiconductor device,
wherein a second switching regulator group including a remaining half, is disposed on a second surface of the system board,
wherein the first surface and the second surface are arranged to have a front-back relationship with each other, and
wherein a phase difference between a phase of an output power supply generated by the first switching regulator group and a phase of an output power supply generated by the second switching regulator group have a predetermined value.

* * * * *